United States Patent
Ishii

(10) Patent No.: US 7,791,088 B2
(45) Date of Patent: Sep. 7, 2010

(54) ELECTRO-OPTICAL DEVICE WITH CONNECTING CONDUCTIVE FILM PROVIDED OPPOSITE TO AN END OF AN INTERLAYER CONDUCTIVE FILM WITH INSULATING SIDEWALL, THE CONDUCTIVE FILM ELECTRICALLY CONNECTING A PIXEL ELECTRODE TO A LOWER ELECTRODE AND METHOD FOR MAKING THE SAME

(75) Inventor: Tatsuya Ishii, Fujimi-cho (JP)

(73) Assignee: Seiko Epson Corporation, Tokyo (JP)

( * ) Notice: Subject to any disclaimer, the term of this patent is extended or adjusted under 35 U.S.C. 154(b) by 86 days.

(21) Appl. No.: 11/565,978

(22) Filed: Dec. 1, 2006

(65) Prior Publication Data

US 2007/0164282 A1 Jul. 19, 2007

(30) Foreign Application Priority Data

Jan. 18, 2006 (JP) ............................. 2006-009583

(51) Int. Cl.
*H01L 31/00* (2006.01)
*H01L 27/14* (2006.01)
*H01L 29/04* (2006.01)
*H01L 29/15* (2006.01)
*H01L 31/036* (2006.01)
*H01L 29/18* (2006.01)
*H01L 25/075* (2006.01)
*H01L 27/088* (2006.01)
*H01L 27/105* (2006.01)
*H01L 33/00* (2010.01)

(52) U.S. Cl. ...................... 257/88; 257/72; 257/E27.06; 257/E27.081; 257/E25.02; 257/E33.001; 257/59

(58) Field of Classification Search ................... 257/71, 257/59, 72, 79, 88, 296, 298, 300, 306, E27.06, 257/E27.081, E25.02, E33.001
See application file for complete search history.

(56) References Cited

U.S. PATENT DOCUMENTS 6,781,154 B2 8/2004 Gotoh (Continued)

FOREIGN PATENT DOCUMENTS

JP A-06-235939 8/1994

(Continued)

*Primary Examiner*—Phat X Cao
*Assistant Examiner*—Diana C Garrity
(74) *Attorney, Agent, or Firm*—Oliff & Berridge, PLC

(57) ABSTRACT

An electrooptic device includes: a plurality of data lines and a plurality of scanning lines that intersect on a substrate; a pixel electrode provided for each of pixels corresponding to the intersection of the data lines and the scanning lines; a first conductive layer provided for each pixel and a second conductive layer provided above the first conductive layer and electrically insulated from the first conductive layer; a third conductive layer provided above the second conductive layer and electrically insulated from the second conductive layer; an insulating side wall provided at an end of the second conductive layer and extending along the thickness of the second conductive layer; and a connecting conductive film disposed opposite to the end with the side wall in between and extending along the thickness to electrically connect the first conductive layer with the third conductive layer.

8 Claims, 11 Drawing Sheets

U.S. PATENT DOCUMENTS

| | | | |
|---|---|---|---|
| 6,864,505 B2 * | 3/2005 | Yamasaki | 257/59 |
| 6,936,844 B1 * | 8/2005 | Yamazaki et al. | 257/59 |
| 2004/0085497 A1 * | 5/2004 | Kawata | 349/111 |
| 2005/0174500 A1 * | 8/2005 | Shiraki et al. | 349/42 |
| 2007/0091241 A1 * | 4/2007 | Lin et al. | 349/144 |

FOREIGN PATENT DOCUMENTS

| | | |
|---|---|---|
| JP | A 2001-290171 | 10/2001 |
| JP | A-2003-273123 | 9/2003 |
| JP | A-2004-109988 | 4/2004 |

* cited by examiner

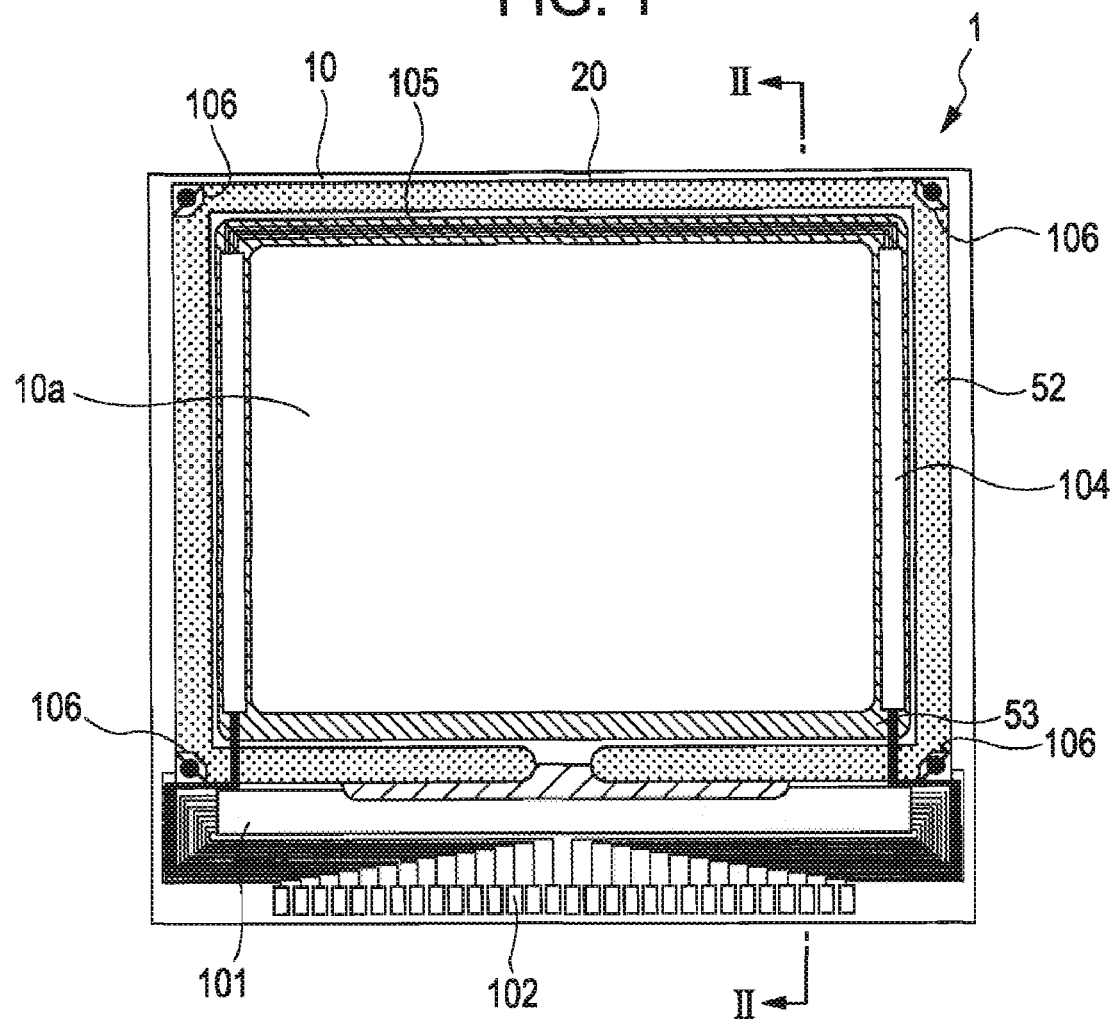
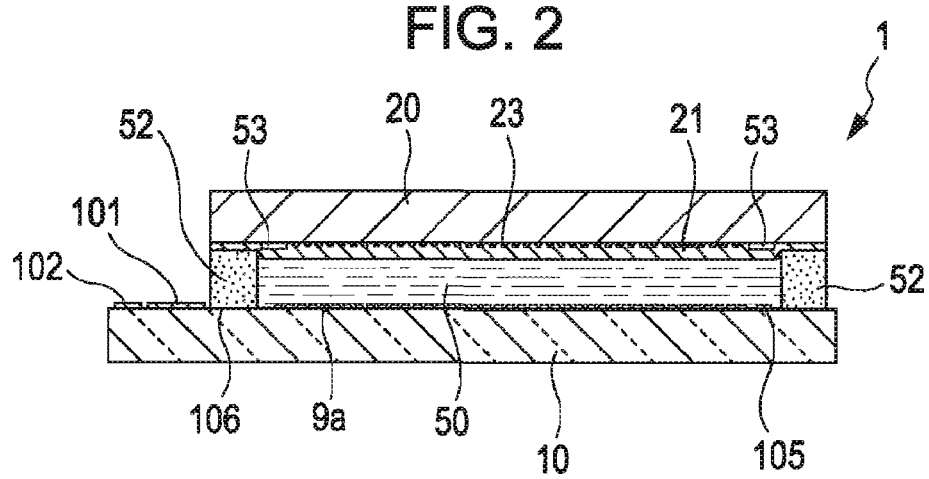

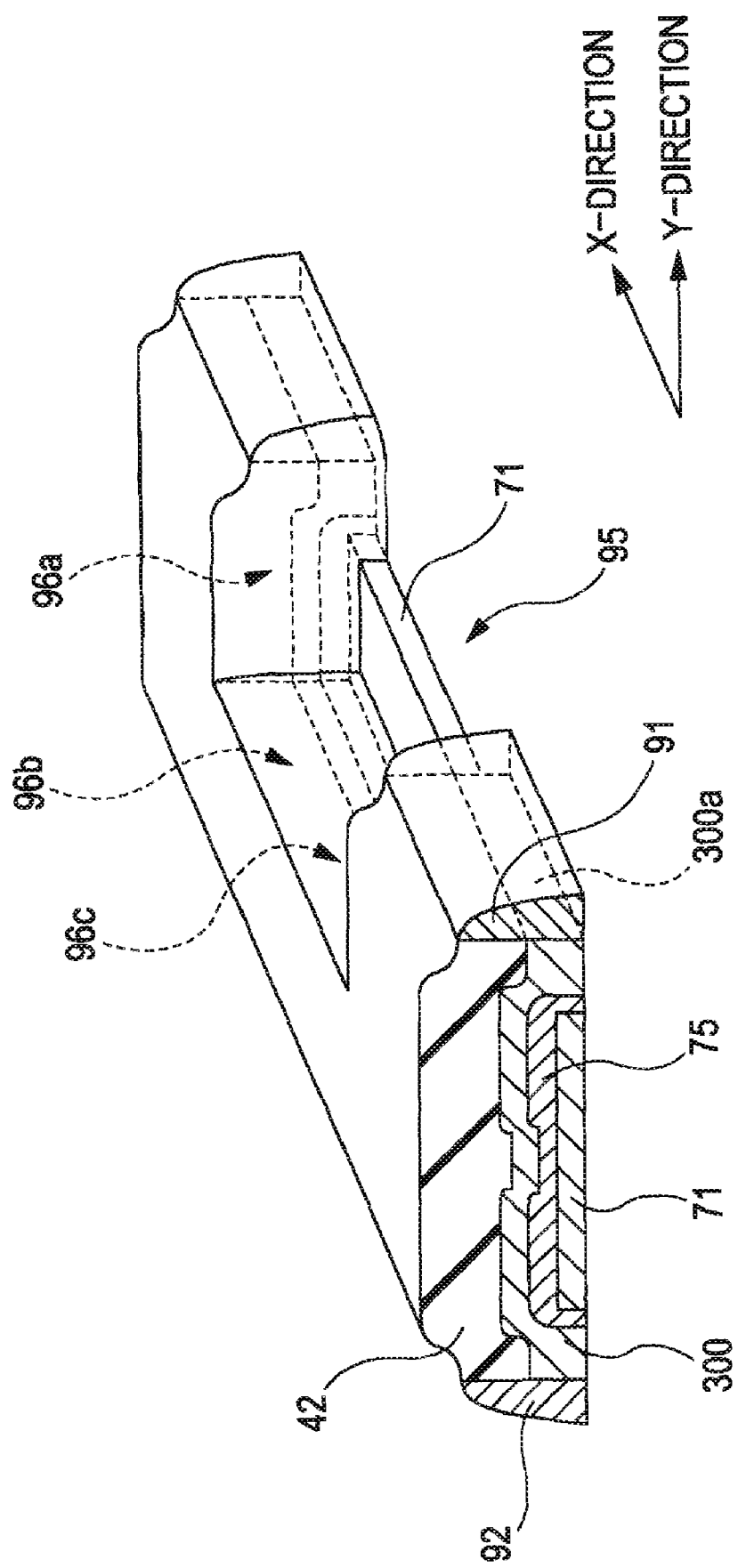

ELECTRO-OPTICAL DEVICE WITH CONNECTING CONDUCTIVE FILM PROVIDED OPPOSITE TO AN END OF AN INTERLAYER CONDUCTIVE FILM WITH INSULATING SIDEWALL, THE CONDUCTIVE FILM ELECTRICALLY CONNECTING A PIXEL ELECTRODE TO A LOWER ELECTRODE AND METHOD FOR MAKING THE SAME

BACKGROUND

1. Technical Field

The present invention relates to a technical field of an electrooptic device such as a liquid crystal device, a method for manufacturing the same, and a structure for electrically connecting conductive parts such as wires or electrodes of a semiconductor device.

2. Related Art

Liquid crystal devices, examples of this type of electrooptic device, often have a holding capacitor in parallel with a liquid-crystal capacitor to prevent the leakage of image signals held in a pixel section. For example, JP-A-2001-290171 (Patent Document 1) discloses a method for manufacturing the holding capacitor. By the method disclosed in Patent Document 1, the distance between the edge of the contact hole for contact with the wire above the upper electrode and the upper electrode of the holding capacitor is determined by two kinds of mask patterns, thus providing electrical insulation, the contact hole being connected to the lower electrode of the holding capacitor.

However, the electrical connection between the lower electrode of the holding capacitor and the wire above the upper electrode via the contact hole using the two kinds of masks, as in the technique of Patent Document 1, has the technical problem of difficulty in expanding the open area of the pixel. More specifically, to form a contact hole in a region where non-optical-transmitting elements that block light that is to pass through the pixel, such as wires, light-shielding films, or semiconductor devices, are formed, it is necessary to design the contact hole while ensuring a margin in consideration with the registration of the two kinds of mask so as to partly remove the insulating layer where the contact hole is to be formed. This increases the proportion of the unopen area of the pixel by an amount corresponding to the margin, posing the problem of difficulty in increasing the display quality due to the high percentage of the unopen area of the pixel.

Furthermore, this arrangement has the problem encountered on designing that the unuseful area of the semiconductor device is increased due to the contact hole which is formed to electrically connect the conductive parts on different layers, such as wires, so that it becomes difficult to minimize the device.

SUMMARY

An advantage of some aspects of the invention is to provide an electrooptic device with a high open area ratio and capable of high-quality image display, a method for the same, and a conductive-layer connection structure that allows miniaturization of devices such as semiconductor devices.

According to a first aspect of invention there is provided an electrooptic device comprising: a plurality of data lines and a plurality of scanning lines that intersect on a substrate; pixel electrode provided for each of pixels corresponding to the intersection of the data lines and the scanning lines; first conductive layer provided for each pixel and a second conductive layer provided above the first conductive layer and electrically insulated from the first conductive layer; a third conductive layer provided above the second conductive layer and electrically insulated from the second conductive layer; an insulating side wall provided at an end of the second conductive layer and extending along the thickness of the second conductive layer; and a connecting conductive film disposed opposite to the end with the side wall in between and extending along the thickness to electrically connect the first conductive layer with the third conductive layer.

In this case, the electrooptic device is constructed such that the second conductive layer is provided above the first conductive layer. The second conductive layer and the first conductive layer may comprise electrodes or wires provided for each pixel or across a plurality of pixels on different layers on the substrate. The electrooptic device may have another layer for insulating the conductive layers between the first and second conductive layers.

The side wall is provided at an end of the second conductive layer to electrically insulate the second conductive layer from, the connecting conductive film. The "end" here includes a new rim formed by removing part of the second conductive layer from the outline of the second conductive layer, as seen from the top. The side wall is formed such that an insulating film having a flat portion extending on the region of the pixel where the second conductive layer is removed and a portion extending along the thickness of the second conductive layer is formed and then the flat portion is removed by anisotropic etching so that the portion extending along the thickness of the second conductive layer remains.

The connecting conductive film is disposed opposite to the end of the second conductive layer with the side wall in between, and extends along the thickness of the second conductive layer. More specifically, the connecting conductive film is formed such that a conductive film is Formed so as to extend from the exposed surface of the first conductive layer along the surface of the side wall, the exposed surface being exposed such that the insulating film of the side wall is partially removed and then it is patterned into a specified shape.

The third conductive layer is electrically connected to the first conductive layer via the connecting conductive film. The third conductive layer may be any conductor provided that it is disposed above the first conductive layer and electrically connected to the first conductive layer according to the design and structure of the electrooptic device.

In this case, the connecting conductive film can electrically connect the first conductive layer and the third conductive layer together while maintaining the electrical insulation between the second conductive layer and the first conductive layer without forming a contact hole in the second conductive layer above the first conductive layer and the layer above the second conductive layer by using a mask.

In this specification, the electrical connection between the first conductive layer and the third conductive layer via the connecting conductive film provided opposite to the second conductive layer with the side wall in between without a contact hole formed using a mask is referred to as "selfalignment contact".

The use of the selfalignment contact in place of the contact hole can reduce the areas of the first conductive layer and the third conductive layer, which are needed to increase the margin for the contact hole, allowing a decrease in the unopen area between the open areas of the pixels. More specifically, the width of the side wall can be reduced within a range that the connecting conductive film and the second conductive layer can be insulated, thereby reducing the unopen area of the pixel. This allows the open area to be increased correspondingly.

Here, the "open area" is the area of a pixel through which light passes, for example, an area for a pixel electrode in which the gray level of the light that has passed through the liquid crystal can be varied with changes in transmittance, in other words, an area where the light concentrated in the pixel is not cut off by the light-shielding film or the semiconductor device. The "unopen area" indicates an area through which the light for display does not pass, for example, the area of the pixel where untransparent wires or electrodes are disposed.

Accordingly, with this arrangement, an open area ratio which is the proportion of the open area of a pixel can be increased, so that display quality of electrooptic devices can be improved. Particularly, when the pixel pitch is decreased to meet the demand for higher display quality, it becomes more difficult to decrease the area of the unopen area by microfabricating wires or electrodes, so that the method of electrical connection by the selfalignment contact offers significant advantages in increasing the open area ratio.

In addition, the arrangement can reduce the unevenness of the multilayer structure on the substrate due to the contact holes of the substrate by the selfalignment contact in place of the contact holes. This prevents the display quality of the electrooptic device such as a liquid crystal device from decreasing because of the unevenness of the substrate that decreases the flatness of the pixel electrode formed on the first conductive layer and the second conductive layer.

Moreover, with the electrooptic device, the number of contact holes to be formed on the substrate can be remarkably decreased by the selfalignment contact in place of the contact holes, so that the yield of manufacturing electrooptic devices can be improved. More specifically, this arrangement can prevent the failure of the contact holes due to accumulation of minute foreign matter, thus decreasing defects such as poor contact.

Thus, the arrangement can improve display quality and manufacturing yield, so that an electrooptic device excellent both in quality and cost can be provided.

In this case, the end may include a portion facing an inner wall of a notch of the second conductive film from which the first conductive film is exposed.

With this arrangement, the notch is formed in such a way that the second conductive layer is partly removed by a known etching method such as anisotropic etching so that the end adjacent to the connecting conductive film is open as viewed from the top. The notch 95 has a portion that faces the inner wall of the notch. The side wall covers the portion that faces the inner wall, thereby electrically insulating the connecting conductive film and the second conductive layer from each other.

Thus, even if part of the second conductive layer is removed so as to increase the contact portion where the connecting conductive film and the first conductive layer are electrically connected, the side wall can reliably insulate the connecting conductive film and the second conductive layer from each other. Moreover, the increase in the contact area of the first conductive layer and the connecting conductive film reduces the contact resistance between the connecting conductive film and the first conductive layer.

In this case, the potential of the second conductive layer may be maintained constant; the first conductive layer may be electrically connected to the pixel electrodes via the third conductive layer and the connecting conductive film; and the second conductive layer and the first conductive layer may configure a storage capacitor together with a dielectric film interposed between the second conductive layer and the first conductive layer With this arrangement, in operation, pixel scanning signals are supplied via the scanning lines and image signals are supplied to the pixels via data lines and switching devices such as thin-film transistors, and the image signals are written to the pixel electrodes and the storage capacitors. This allows specified kinds of operation such as active matrix driving for multiple pixels. In this case, the presence of the storage capacitor improves the potential holding characteristic of the pixel electrode and the display characteristics such as contrast and flicker.

This arrangement can reduce the thickness of the side wall in a range that the insulation between the connecting conductive film and the second conductive layer is maintained. This allows an increase in the area of the second conductive layer toward the side wall by the amount of the decrease in the thickness of the side wall, thus allowing an increase in the overlapping area of the first conductive layer and the second conductive layer, as viewed from the top. This allows an increase in the storage capacitor configured by the first conductive layer, the second conductive layer, and the dielectric film. This further enhances the potential holding characteristic by the storage capacitor, thus allowing a further improvement in display characteristic such as contrast and flickering.

In this case, the first conductive layer may be a polysilicon film; and the conductivity of the second conductive layer may be higher than that of the polysilicon film.

This arrangement can reduce an increase in electric resistance which increases with the area of the second conductive layer appropriately even if the second conductive layer extends across multiple pixels, thus preventing a decrease in display quality due to the electric resistance at the driving, or more specifically, preventing a decrease in responsibility in displaying images by the electrooptic device.

The electrooptic device may further include: a plurality of thin-film transistors whose sources are individually electrically connected to the data lines, and whose gates are individually electrically connected to the scanning lines. Of the plurality of thin-film transistors, a pair of first and second adjacent thin-film transistors arranged in the direction in which the data lines extend may be arranged such that the sources and the drains are in mirror symmetry in the direction in which the data lines extend. A contact hole that electrically connects the source of the first thin-film transistor to the data line and a contact hole that electrically connects the source of the second thin-film transistor to the data line may be the same.

In this case, the plurality of thin-film transistors are provided for the pixels respectively, and function as switching devices for switching the conduction between the data lines and the first conductive layers for supplying image signals to the pixel electrodes.

The scanning line, the data line, the second conductive layer, the first conductive layer, and the thin-film transistor are disposed on the substrate and in the unopen area surrounding the open area of each pixel corresponding to the pixel electrode. That is, the scanning line, the data line, the second conductive layer, the first conductive layer, and the thin-film transistor are disposed not in the open area of each pixel but in the unopen area so as not to be an obstacle to display. Particularly, a pair of the thin-film transistors is disposed such that the source and the drain are disposed in rows in mirror symmetry (for example, in the Y-direction) in the pixel region including multiple pixels in matrix form. A pair of the thin-film transistors next to each other in the direction of row (for example, in the Y-direction) is disposed in mirror symmetry in the direction of row.

Accordingly, this arrangement allows shared use of a contact hole that electrically connects the source of the first thin-film transistor of a pair of thin-film transistors arranged in mirror symmetry to the data line and a contact hole that electrically connects the source of the second thin-film transistor to the data line. Here the "contact hole" indicates a hole that passes through the interlayer insulating film on the thin-film transistor along the thickness thereof. For example, the contact hole may be in contact with the sources of the thin-film transistor either with a structure in which the data line is put in the hole (that is, the contact hole), or with a structure in which a conductive material is embedded in the hole, one end of which is in contact with the conductive layer of the data line and the other end is in contact with the source.

This arrangement can remarkably reduce the number of contact holes in comparison with a case where the data line and the source are Individually electrically connected pixel by pixel, thus enhancing the manufacturing yield of electrooptic devices. Moreover, this arrangement can reduce the proportion of the unopen area of the pixel in the direction of the scanning line owing to the decrease in the number of the contact holes, thereby increasing the an open area ratio.

This arrangement can increase display quality while achieving miniaturization and high definition of the device owing to the small pitch of pixels.

According to a second aspect of the invention, there is provided a method for manufacturing an electrooptic device, the method comprising: forming a first conductive layer provided for each of pixels corresponding to the intersection of a plurality of data lines and a plurality of scanning lines on a substrate; forming a second conductive layer insulated from the first conductive layer above the first conductive layer; forming an insulating side wall at an end of the second conductive layer, the side wall extending along the thickness of the second conductive layer; forming a connecting conductive film extending along the thickness opposite to the end with the side wall in between; and forming a third conductive layer above the second conductive layer, the third conductive layer being electrically connected to the first conductive layer via the connecting conductive film.

By the method for manufacturing an electrooptic device, high-display-quality electrooptic devices can be manufactured and the manufacturing yield can be enhanced, so that electrooptic devices excellent both in quality and cost can be manufactured.

According to a third aspect of the invention, there is provided a conductive-layer connection structure, comprising: a first conductive layer and a second conductive layer electrically insulated from each other on a substrate; an insulating side wall provided at an end of the second conductive layer and extending along the thickness of the second conductive layer; a connecting conductive film disposed opposite to the end with the side wall in between and extending along the thickness; and a third conductive layer provided above the second conductive layer and electrically connected to the first conductive layer via the connecting conductive film.

With the connection structure, the interval between the connecting conductive film and the second conductive layer can be reduced by decreasing the thickness of the side wall, as described above for the electrooptic device, so that the connection structure can be reduced in size as compared with the structure having a contact hole.

Accordingly, application of the connection structure to various electrooptic devices such as semiconductor devices can reduce the size of the electrooptic devices.

The operation and other advantages of the invention will be described in the following embodiment.

BRIEF DESCRIPTION OF THE DRAWINGS

The invention will be described with reference to the accompanying drawings, wherein like numbers reference like elements.

FIG. 1 is a plan view of an electrooptic device according to an embodiment of the invention.

FIG. 2 is a cross-sectional view taken along line II-II of FIG. 1.

FIG. 8 is a perspective view of the partly cut-away portion of an upper capacitor electrode, as viewed from the cross section VIII-VIII of FIG. 4.

DESCRIPTION OF EXEMPLARY EMBODIMENTS

Figure 3:
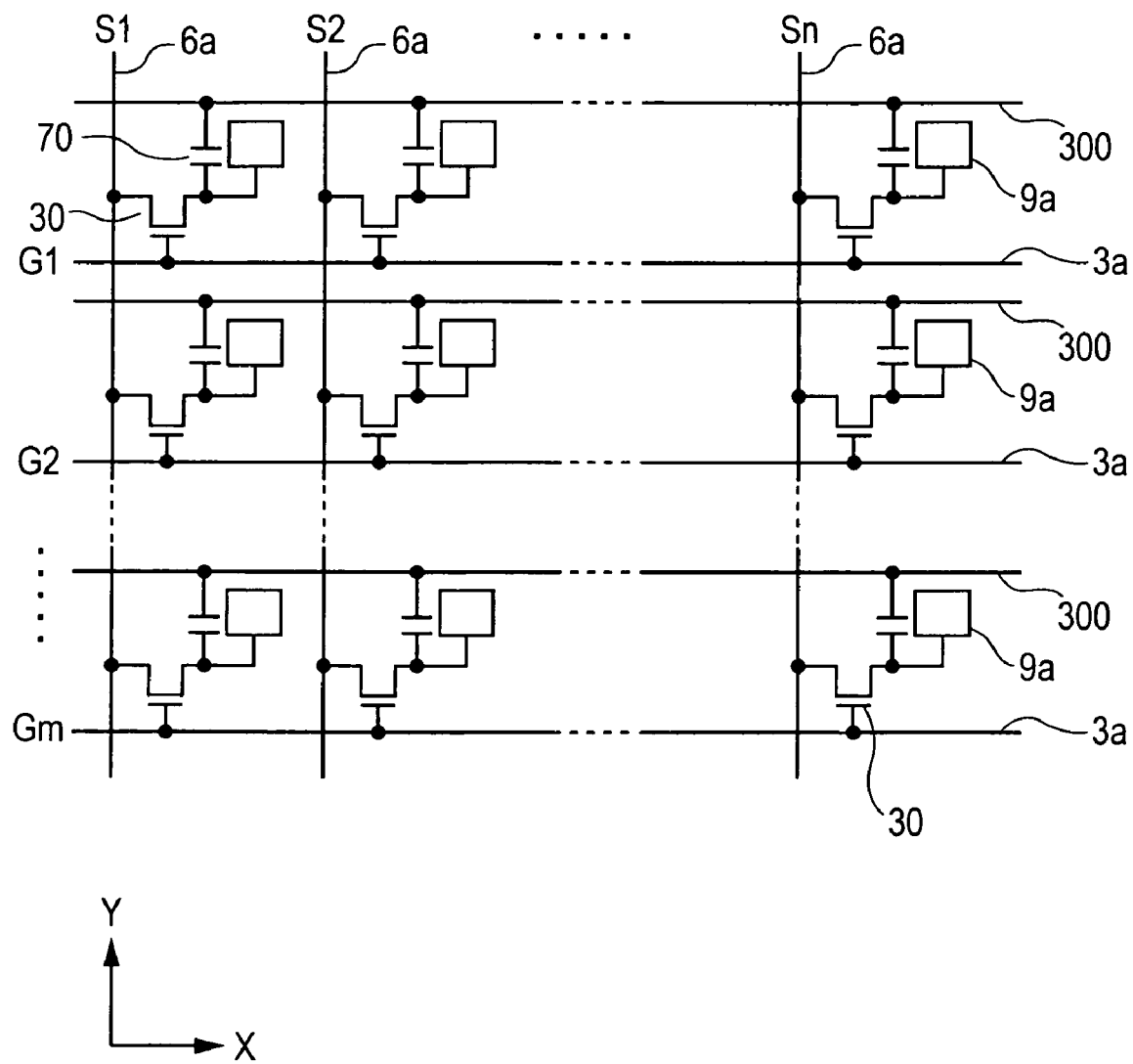
FIG. 3 is a diagram of an equivalent circuit of various elements and wires of the pixels in matrix form on the image display region of a liquid crystal device.

An electrooptic device, a method for the same, and a conductive-layer connection structure according to an embodiment of the invention will be described with reference to the drawings.

1. Electrooptic Device 1-1. Entire Structure of Electrooptic Device

Referring first to FIGS. 1 and 2, an electrooptic device according to an embodiment of the invention will be described. FIG. 1 is a plan view of the electrooptic device including a TFT array substrate and components thereon, viewed from the opposing substrate; FIG. 2 is a cross-sectional view taken along line II-II of FIG. 1. The embodiment takes a TFT active-matrix-driving liquid crystal device having a drive circuit built-in by way of example.

Referring to FIGS. 1 and 2, a liquid crystal device 1 has a TFT array substrate 10 and an opposing substrate 20 opposed to each other. A liquid crystal layer 50 is sealed in between the TFT array substrate 10 and the opposing substrate 20. The TFT array substrate 10 and the opposing substrate 20 are bonded to each other with a sealant 52 disposed In a sealing region around an image display region 10a or a pixel region having a plurality of pixel sections.

The sealant 52 is composed of, for example, ultraviolet cure resin or thermosetting resin for bonding the substrates together. The sealant 52 is applied onto the TFT array substrate 10 in the manufacturing process and then hardened under ultraviolet irradiation or heat. The sealant 52 contains scattered gap members, such as glass fibers or glass beads, for providing a specified interval (intersubstrate gap) between the TFT array substrate 10 and the opposing substrate 20. Accordingly, the electrooptic device according to the embodiment is compact and suitable or enlarged display as the light valve of a projector.

A frame light-shielding film 53 that defines the frame of the image display region 10a is provided to the opposing substrate 20 in parallel with the inside of the sealing region having the sealant 52. However, part or all of the frame light-shielding film 53 may be provided to the TFT array substrate 10 as a built-in light-shielding film.

There is a peripheral region around the image display region 10a. In other words, particularly in this embodiment, the region apart from the frame light-shielding film 53 with respect to the center of the TFT array substrate 10 is defined as a peripheral region.

Of the peripheral region, the region outside the sealing region having the sealant 52 has a data-line drive circuit 101 and an external-circuit connecting terminal 102 along a first side of the TFT array substrate 10. Scanning-line drive circuits 104 are disposed along the two sides adjacent to the first side in such a manner as to be covered with the frame light-shielding film 53. To connect the two scanning-line drive circuits 104 on both sides of the image display region 10a, a plurality of wires 105 is disposed along the remaining side of the TFT array substrate 10 in such a manner as to be covered with the frame light-shielding film 53.

There are vertically conducting materials 106 for conducting the substrates at the four corners of the opposing substrate 20. On the other hand, the TFT array substrate 10 has vertically conducting terminals at the portions corresponding to the corners. This allows electrical conduction between the TFT array substrate 10 and the opposing substrate 20.

Referring to FIG. 2, the TFT array substrate 10 has thereon TFT-s for switching pixels, scanning lines, data lines, and pixel electrodes 9a. An alignment layer is formed on the pixel electrodes 9a. On the other hand, the opposing substrate 20 has thereon opposing electrodes 21, a grid or stripe light-shielding film 23, and also an uppermost alignment layer. The liquid crystal layer 50 is made of one nematic liquid crystal or a mixture of several kinds of nematic liquid crystal, and is aligned in a specified orientation between the pair of alignment layers.

The TFT array substrate 10 is a transparent substrate such as a quartz substrate, a glass substrate, or a silicon substrate. The opposing substrate 20 is also a transparent substrate as is the TFT array substrate 10.

The TFT array substrate 10 has the pixel electrodes 9a thereon, on which the alignment layer subjected to a specified alignment process such as rubbing is provided. For example, the pixel electrode 9a is made of a transparent conductive film such as an indium tin oxide (ITO) film, while the alignment layer is made of an organic film such as a polyimide film.

The opposing substrate 20 has opposing electrodes 21 over the entire surface, under which an alignment layer subjected to a specified alignment process such as rubbing is provided. The opposing electrode 21 is made of a transparent conductive film such as an ITO film, while the alignment layer is made of an organic film such as a polyimide film.

The opposing substrate 20 may have a grid or stripe light-shielding film. This structure more reliably prevents the light from the TFT array substrate 10 from entering a channel region 1a' or the periphery thereof together with the upper light-shielding film provided as an upper capacitor electrode 300.

The liquid crystal layer 50 is formed between the TFT array substrate 10 and the opposing substrate 20 with such a structure that the pixel electrode 9a and the opposing electrode 21 are opposed. The liquid crystal layer 50 is aligned in a specified orientation by the alignment layer with no electric field applied from the pixel electrode 9a.

In addition to the drive circuits including the data-line drive circuit 101 and the scanning-line drive circuit 104, the TFT array substrate 10 shown in FIGS. 1 and 2 may have thereon a sampling circuit for sampling the image signals on image signal lines and supplying it to the data lines; a precharge circuit for supplying precharge signals with a predetermined voltage level to the data lines ahead of the image signals; and an inspection circuit for checking the quality and defect of the electrooptic device during manufacture or at shipment.

1-2. Electrical Connection of Pixel Section

Referring then to FIG. 3, the electrical connection of the pixel section of the liquid crystal device 1 will be specifically described. FIG. 3 shows an equivalent circuit of various elements and wires of the pixels in matrix form on the image display region of the liquid crystal device 1.

Referring to FIG. 3, the pixels in matrix form on the image display region of the liquid crystal device 1 each have the pixel electrode 9a and a TFT 30. The TFT 30 is electrically connected to the pixel electrode 9a and controls the switching of the pixel electrode 9a at the activation of the liquid crystal device 1. A data line 6a, to which an image signal is supplied, is electrically connected to the source of the TFT 30. Image signals S1 to Sn may be supplied to the data line 6a line-sequentially or, alternatively, may be supplied to the adjacent data lines 6a group by group.

A scanning line 3a is electrically connected to the gate of the TFT 30. The liquid crystal device 1 applies pulsated scanning signals G1 to Gm to the scanning line 3a in that order an a specified timing. The pixel electrode 9a is electrically connected to the drain of the TFT 30, to which the image signals S1 to Sn supplied from the data line 6a are written at a specified timing by the closing of the switch of the TFT 30, which is a switching element, for a fixed period. The specified-level image signals S1 to Sn written to the liquid crystal as an example of an electrooptic material via the pixel electrode 9a are held between the pixel electrode 9a and the opposing electrode on the opposing substrate.

The liquid crystal modulates light to allow gray-scale display by changing in orientation or order of the molecule sets depending on the level of the voltage applied. In a normally white mode, the light transmittance is decreased with the voltage applied on a pixel basis; in a normally black mode, the light transmittance is increased with the voltage applied on a pixel basis. Consequently, the electrooptic device emits light with a contrast according to the image signal. To prevent the leakage of the held image signals, there is a storage capacitor 70 in parallel with the liquid-crystal capacitor formed between the pixel electrode 9a and the opposing electrode. This arrangement improves the potential holding characteristic of the pixel electrode 9a and the display characteristics such as contrast and flicker.

1-3. Concrete Structure of Pixel Section

Figure 4:
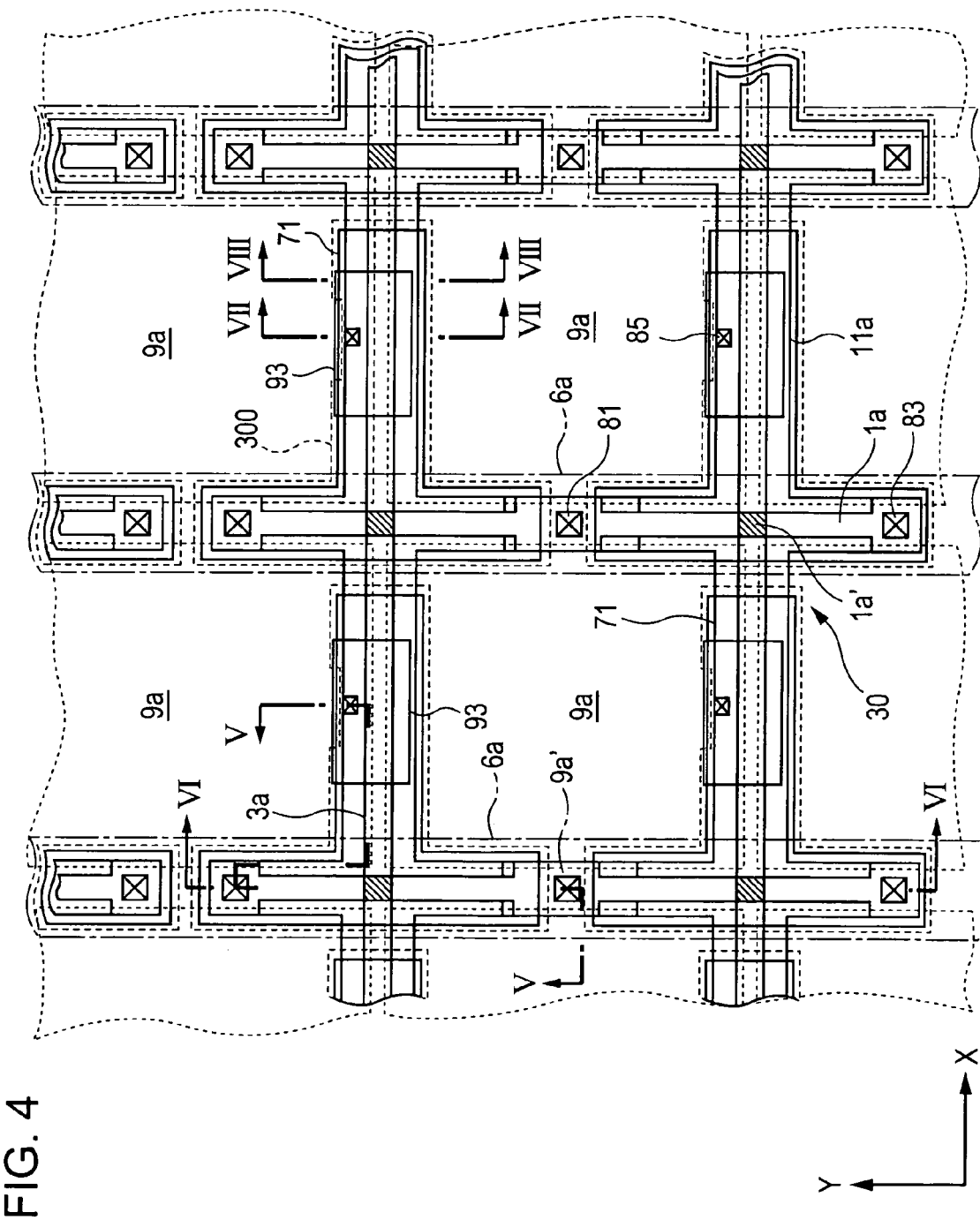
FIG. 4 is a plan view of multiple adjacent pixels of the electrooptic device according to this embodiment.
Figure 5:
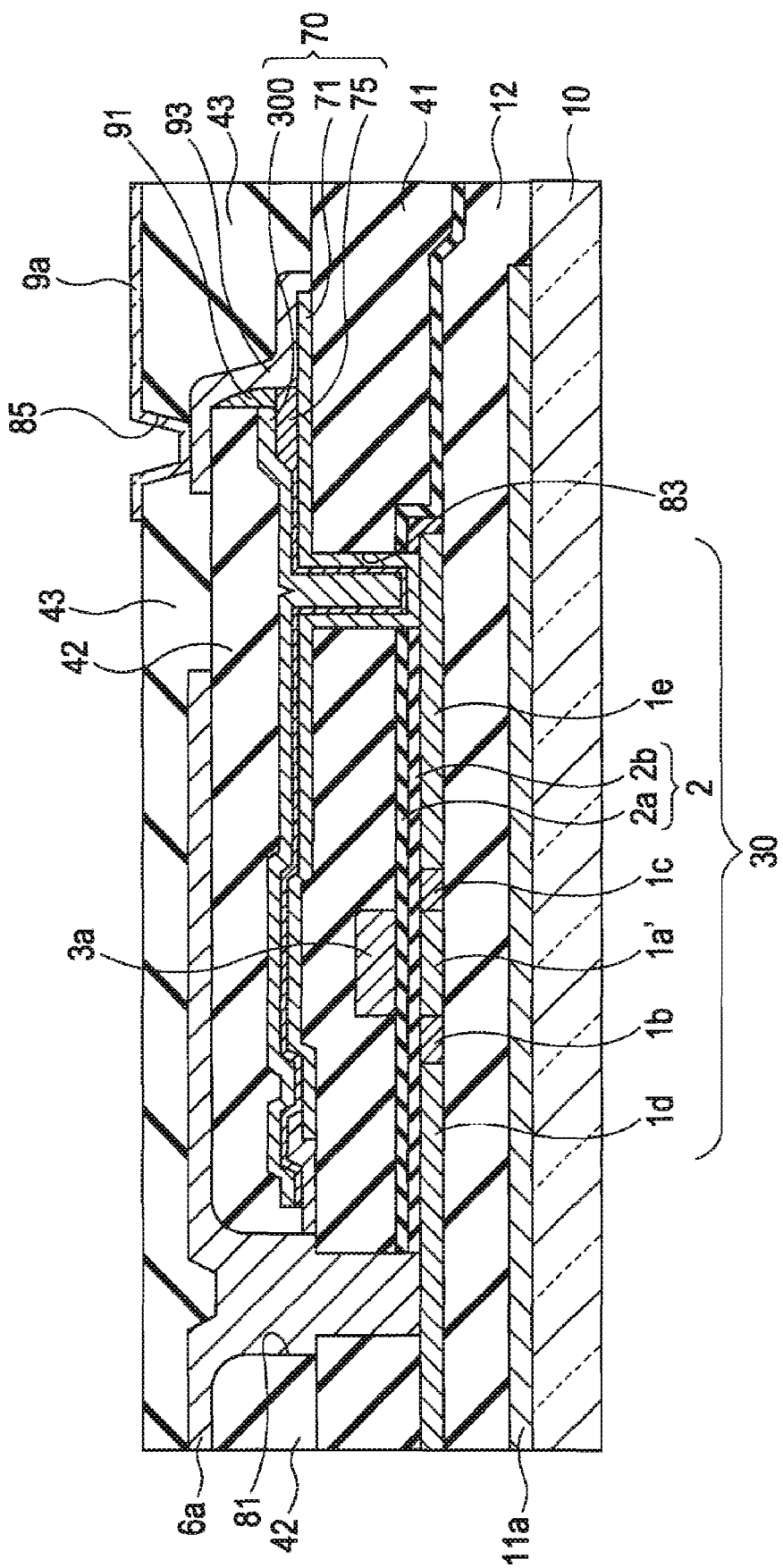
FIG. 5 is a cross-sectional view taken along line V-V of FIG. 4.
Figure 6:
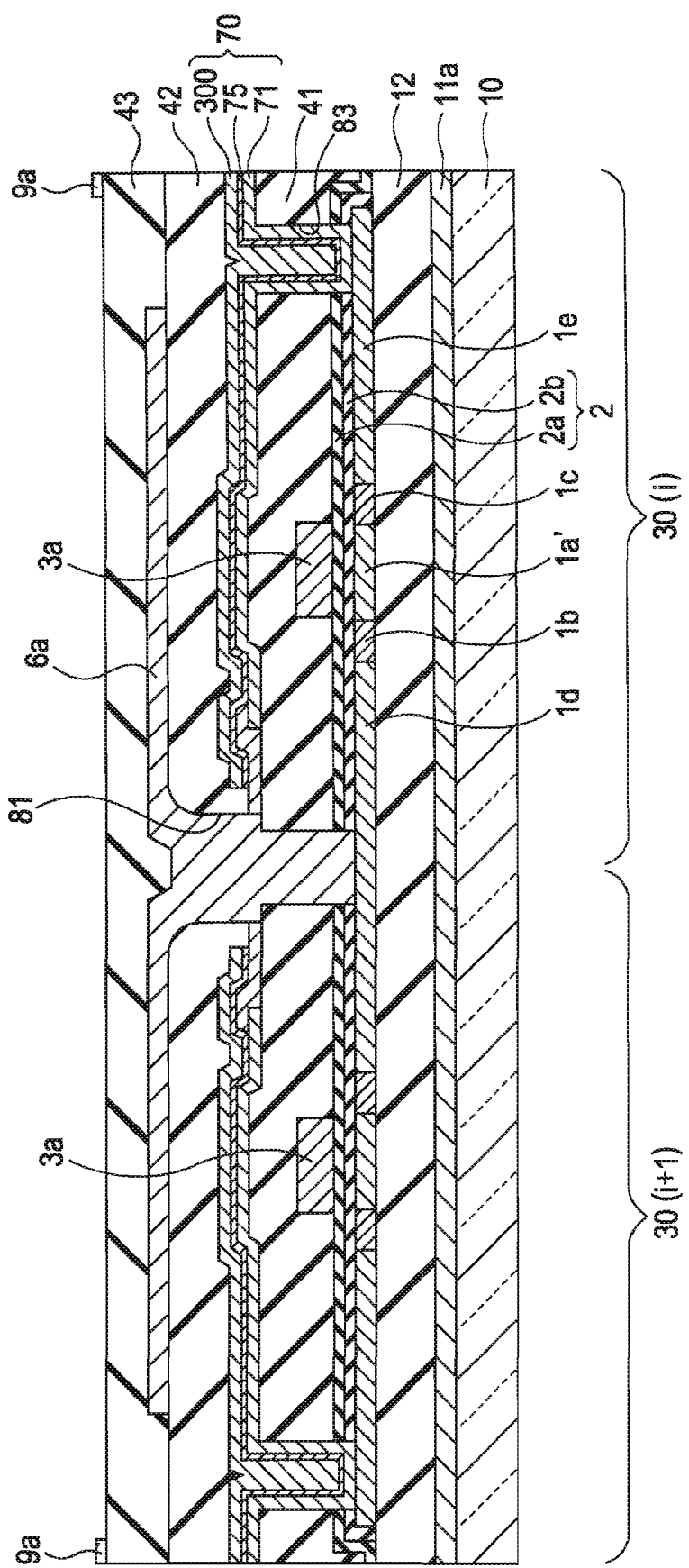
FIG. 6 is a cross-sectional view taken along line V1-V1 of FIG. 4.

A concrete structure of the pixel section will be described with reference to FIGS. 4 to 8. FIG. 4 is a plan view of multiple adjacent pixels on the TFT array substrate having data lines, scanning lines, and pixel electrodes; FIG. 5 is a cross-sectional view taken along line V-V of FIG. 4; and FIG. 6 is a cross-sectional view taken along line VI-VI of FIG. 4. In FIGS. 5 and 6, the scale differs from one layer to another and from one member to another for the purpose of recognition on the drawings, and the part above the pixel electrode 9a is not shown for the convenience of description.

In FIGS. 4 and 5, a plurality of transparent pixel electrodes 9a (outlined by a dotted line 9a') is disposed in matrix form in the X-direction and Y-direction on the TFT array substrate 10 of the liquid crystal device 1. The data lines 6a and the scanning lines 3a are provided along the boundaries of the pixel electrodes 9a.

The scanning line 3a is opposed to a channel region 1a' of a semiconductor layer 1a, indicated by oblique lines in FIG. 4. The TFTs 30 for switching Pixels are disposed at the intersections of the scanning lines 3a and the data lines 6a.

The data line 6a is formed on a second interlayer insulating film 42 having a flat top surface, shown in FIG. 5, and is electrically connected to a high-density source region 1d of the TFT 30 of the semiconductor layer 1a via a contact hole 81. The data line 6a and the interior of the contact hole 81 is composed of, for example, an aluminum containing material containing aluminum, silicon, and copper or aluminum and copper, an aluminum simple substance, or a multilayer of aluminum and titanium nitride. The data line 6a also has the function of shading the TFT 30.

A lower capacitor electrode 71 and the upper capacitor electrode 300 are opposed with a dielectric film 75 in between. The lower capacitor electrode 71 is a pixel-potential-side capacitor electrode connected to a high-density drain region 1e of the TFT 30 and the pixel electrode 9a. The upper capacitor electrode 300 extends from the image display region 10a having the pixel electrode 9a to the periphery thereof, and is electrically connected to a constant potential source. The upper capacitor electrode 300 is a fixed-potential-side capacitor electrode whose potential is maintained at a fixed potential.

The upper capacitor electrode 300 contains, for example, metal or alloy, and is disposed on the TFT 30, so that it functions as an upper light-shielding film (built-in light-shielding film) for shading the TFT 30. The upper capacitor electrode 300 is made of a metal single material, an alloy, a metal silicide, a polysilicide, or a multilayer thereof containing at least one of high melting metals such as titanium, chrome, tungsten, tantalum, molybdenum, and palladium The upper capacitor electrode 300 may contain another metal such as aluminum or silver.

The lower capacitor electrode 71 is made of a conductive polysilicon film, and the functions of a pixel-potential-side capacitor electrode and a light-absorbing or light-shielding film disposed between the upper capacitor electrode 300 and the TFT 30 serving as an upper light-shielding film, and the function of connecting the pixel electrode 9a and the high-density drain region 1e of the TFT 30.

Accordingly, in this embodiment, the conductivity of the upper capacitor electrode 300 is higher than that of the lower capacitor electrode 71 made of a polysilicon film. The upper capacitor electrode 300 and the lower capacitor electrode 71 can reduce an increase in electric resistance which increases with the area of the upper capacitor electrode 300 appropriately even If the upper capacitor electrode 300 extends across multiple pixels, offering the advantage of preventing a decrease in display quality due to the electric resistance at the driving of the liquid crystal device 1, or more specifically, preventing a decrease in responsibility in displaying Images by the liquid crystal device 1. This advantage is not limited to the case where the upper capacitor electrode 300 extends across adjacent pixels along the Y-direction, as in this embodiment, but is remarkable when the upper capacitor electrode 300 is formed across multiple pixels in a large area of the image display region 10a.

The upper capacitor electrode 300 may have a multilayer structure in which a first layer made of, for example, a conductive polysilicon film and a second layer made of a metal silicide film or the like containing high melting metal are stacked. The lower capacitor electrode 71 may be made of a single layer or a multilayer containing metal or alloy, as is the upper capacitor electrode 300. The dielectric layer 75 is made of a silicon oxide film such as a high-temperature oxide (HTO) film or a low-temperature oxide (LTO) film or a silicon nitride layer.

A grid lower light-shielding film 11a provided at the lower part of the TFT 30 with a foundation insulating film 12 in between shields the channel region 1a' of the TFT 30 and its periphery from the return light incident on the device from the TFT array substrate 10. The lower light-shielding film 11a is made of a metal single material, an alloy, a metal silicide, a polysilicide, or a multilayer thereof containing at least one of high melting metals such as titanium, chrome, tungsten, tantalum, molybdenum, and palladium, as is the upper capacitor electrode 300.

The foundation insulating film 12 has the function of insulating the TFT 30 from the lower light-shielding film 11a, and, since it is formed over the entire surface of the TFT array substrate 10, it also has the function of preventing the roughness of the surface of the TFT array substrate 10 due to grinding and the degradation of the characteristics of the pixel-switching TFT 30 due to dirt remaining after cleaning. The pixel electrode 9a is electrically connected to the high-density drain region 1e of the semiconductor layer 1a via the lower capacitor electrode 71, a contact hole 83, a connecting conductive film 93, and a contact hole 85. Part of the pixel electrode 9a extends to the contact hole 85. The pixel electrode 9a is formed such that a conductive material such as an ITO is formed on the inner wall of the contact hole 85 passing through a third Interlayer insulating layer 43.

FIG. 5 shows a lightly doped drain (LDD) structure including the channel region 1a' of the semiconductor layer 1a, which is formed by the electric field from the scanning line 3a which is used both as a gate electrode, a gate insulating layer 2 including two insulating layers 2a and 2b for insulating the scanning line 3a and the semiconductor layer 1a from each other, a low-density source region 1b, a low-density drain region 1c, a high-density source region 1d, and the high-density drain region 1e. The low-density source region 1b, the low-density drain region 1c, the high-density source region 1d, and the high-density drain region 1e constitute an impurity region of the semiconductor layer 1a, and is provided on both sides of the channel region 1a, in mirror symmetry. The TFT 30 can decrease off-current flowing in the low-density source region 1b and the low-density drain region 1c while the TFT 30 is out of operation, and prevent a decrease in on-current flowing during the operation of the TFT 30. Thus, the liquid crystal device 1 can display high-quality images during the operation.

A first interlayer insulating film 41 having a contact hole 81 connected to the high-density source region 1*d* and the contact hole 83 connected to the high-density drain region 1*e* is formed on the scanning line 3*a*. The lower capacitor electrode 71 and the upper capacitor electrode 300 are formed on the air cleaner 41, on which a second interlayer insulating film 42 having the contact hole 81 is formed. The third interlayer insulating film 43 having the contact hole 85 is formed so as to cover the entire surface of the second interlayer insulating film 42 and the connecting conductive film 93 from above the data line 6*a*. The pixel electrode 9*a* and the alignment layer (not shown) are formed on the upper surface of the third interlayer insulating film 43.

Referring to FIGS. 4 and 6, the scanning line 3*a*, the data line 6*a*, the lower light-shielding film 11*a*, and the TFT 30 are disposed on the TFT array substrate 10 and in the unopen area surrounding the open area of each pixel (the area of the pixel which the light for display passes through or is reflected) corresponding to the pixel electrode 9*a*. That is, the scanning line 3*a*, the data line 6*a*, the lower light-shielding film 11*a*, and the TFT 30 are disposed nor in the open area of each pixel but in the unopen area so as not to be an obstacle to display. Particularly, in this embodiment, a pair of the TFTs 30 is disposed such that the high-density source region 1*d* and the high-density drain region 1*e* are disposed in rows in mirror symmetry (in the Y-direction in FIG. 4). For example, assuming that the vertical direction is the direction of row (in the Y-direction in FIG. 4), a pair of the TFTs 30 is vertically reversed or vertically mirror reversed TFTs 30. The plurality of TFTs 30 disposed in mirror symmetry shares the source of the i$^{th}$ TFT 30(*i*) in the direction of row and the source of the (i+1)$^{th}$ TFT 30(*i*+1).

The contact hole 81 electrically connects the source of the TFT 30(*i*) and the source of the TFT 30(*i*+1) to the data line 6*a*. In other words, the TFT 30(*i*) and the TFT 30(*i*+1) are electrically connected to the data line 6*a* via the common contact hole 81.

The contact hole 81 may be in contact with the sources of the TFT 30(*i*) and the TFT 30(*i*+1) either with a structure in which the conductive layer of the data line 6*a* is put in the contact hole 81, or with a structure in which a conductive material is embedded in the contact hole 81, one end of which is in contact with the conductive layer of the data line 6*a* and the other end is in contact with the source of the TFT 30(*i*) and the TFT 30(*i*+1).

Accordingly, the high-density source regions id of both a pair of TFTs (the TFT 30(*i*) and the TFT 30(*i*+1) of FIG. 6) can be electrically connected to the data line 6*a* only by the contact hole 81.

The use of the contact hole 81 can remarkably reduce the number of contact holes in comparison with a case where the data line 6*a* and the source are individually electrically connected pixel by pixel, thus enhancing the manufacturing yield of electrooptic devices.

Moreover, the use of the contact hole 81 can reduce the space as a margin for forming a contact hole in an unopen area since the number of contact holes which electrically connect the TFTs 30 and the data lines 6*a* together is decreased. This increases the proportion of the unopen area in the pixels in the X-direction in the drawing, thereby increasing an open area ratio.

Thus, the shared use of the contact hole 81 which electrically connects the TFT 30 and the data line 6*a* by adjacent pixels allows an increase in display quality while achieving miniaturization and high definition of the device owing to the small pitch of pixels.

Figure 7:
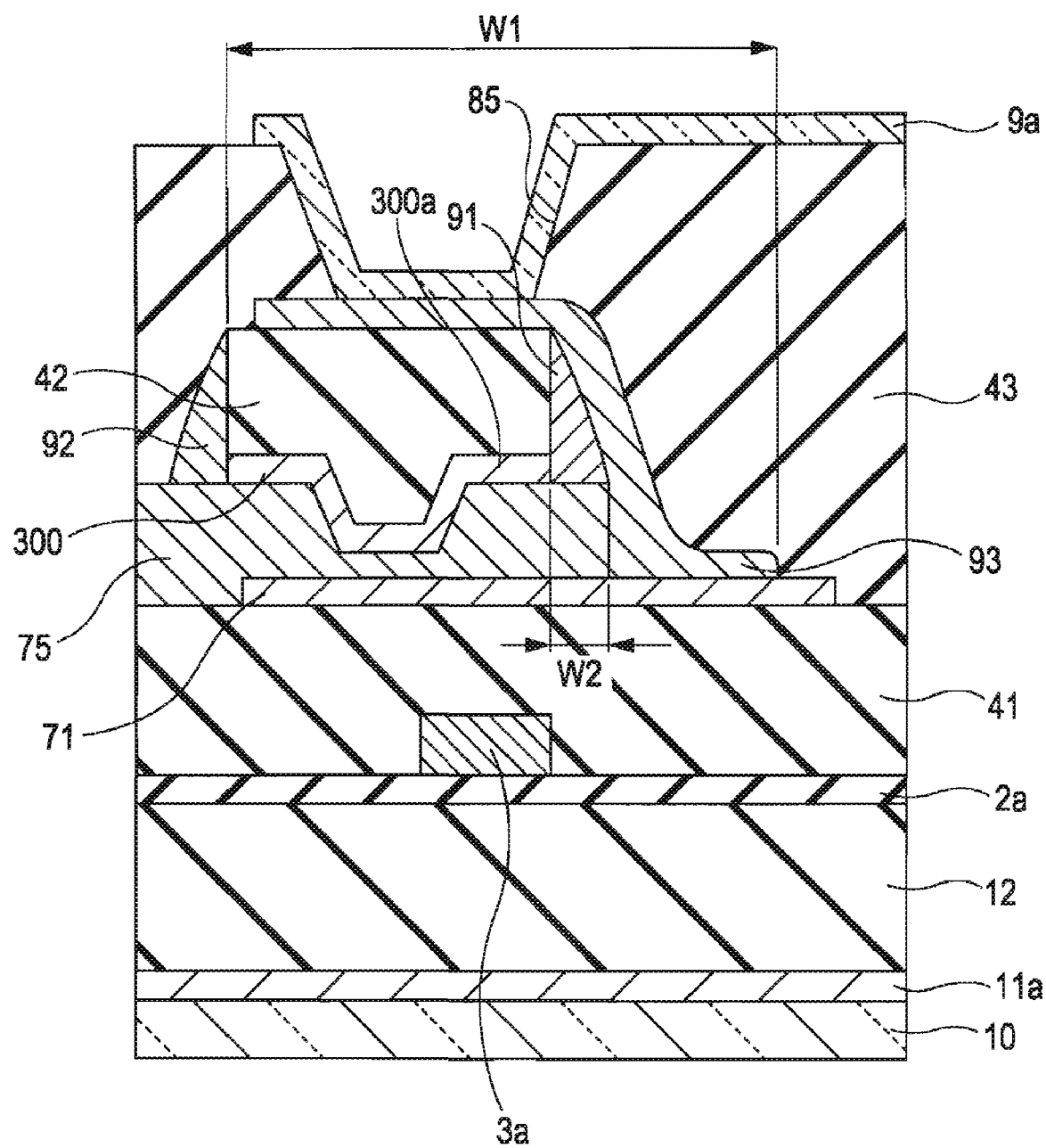
FIG. 7 is an enlarged view of the cross section VII-VII of FIG. 4.

Referring now to FIGS. 7 and 8, the structure of the vicinity of the contact hole 85 of the nonpixel section will be specifically described. FIG. 7 is an enlarged view of the cross section VII-VII of FIG. 4; and FIG. 8 is a perspective view of the partly cut-away portion of the upper capacitor electrode, as viewed from the cross section VIII-VIII of FIG. 4.

In FIG. 7, the liquid crystal device 1 includes the upper capacitor electrode 300 and the lower capacitor electrode 71 formed in different layers on the TFT array substrate 10 and insulated by the dielectric film 75, a side wall 91, a connecting conductive film 93, and the contact hole 85, The side wall 91 is made of an insulating film and disposed at an end 300*a* of the upper capacitor electrode 300 and extends along the thickness of the upper capacitor electrode 300. The end 300*a* of the upper capacitor electrode 300 includes a new rim formed by removing part of the upper capacitor electrode 300 from the outline of the upper capacitor electrode 300, as seen from the top.

The side wall 91 is formed such that an insulating film having a flat portion extending on the region of the pixel where the upper capacitor electrode 300 is removed and a portion extending along the thickness of the upper capacitor electrode 300 is formed and then the flat portion is removed by anisotropic etching so that the portion extending along the thickness of the upper capacitor electrode 300 remains.

The connecting conductive film 93 is disposed opposite to the end 300*a* with the side wall 91 in between, and extends along the thickness of the upper capacitor electrode 300. The connecting conductive film 93 extends along the surface of the side wall 91 onto the second interlayer insulating film 42 from the exposed surface of the lower capacitor electrode 71 which is exposed such that the insulating film of the side wall 91 is partially removed. The connecting conductive film 93 is formed in such a manner that a conductive layer is formed so as to extend along the surface of the side wall 91 onto the second interlayer insulating film 42 from the lower capacitor electrode 71 and then it is patterned into a specified shape.

The part of the pixel electrode 9*a* which extends along the inner wall of the contact hole 85 is in contact with the connecting conductive film 93 extending on the second interlayer insulating film 42. The upper capacitor electrode 300, the lower capacitor electrode 71, and the dielectric film 75 interposed therebetween configure the storage capacitor 70, and the pixel electrode 9*a* and the lower capacitor electrode 71 are electrically connected by the connecting conductive film 93. Accordingly, in this embodiment, the storage capacitor 70 for displaying high-quality images can be formed while allowing image signals to be supplied to the pixel electrode 9*a* via the TFT 30. The embodiment takes an example in which the lower capacitor electrode 71 and the pixel electrode 9*a* are electrically connected by the connecting conductive film 93. Alternatively, the connecting conductive film 93 may connect the electrodes or wires formed on each pixel or across multiple pixels of different layers on the TFT array substrate 10.

The connecting conductive film 93 electrically connects the lower capacitor electrode 71 and the upper capacitor electrode 300 together while maintaining the electrical insulation between the upper capacitor electrode 300 and the lower capacitor electrode 71 without via the contact hole which is formed in the upper capacitor electrode 300 above the dielectric film 75 and in the third interlayer insulating film 43 on the upper capacitor electrode 300 by using a mask.

The use of the connecting conductive film 93 can reduce the areas of the lower capacitor electrode 71 and the upper capacitor electrode 300, which are needed to increase the margin for the contact hole, allowing a decrease in the unopen area between the open areas of the pixels More specifically, the width W2 of the side wall 91 can be reduced within a range that the connecting conductive film 93 and the upper capacitor electrode 300 can be insulated. This reduces the width W1 of the unopen area of the pixel according to the width W2 of the side wall 91, thereby increasing the open area of the pixel along the Y-direction of FIG. 4. More specifically, the distance between the connecting conductive film 93 and the upper capacitor electrode 300 can be reduced from one eighth to one tenth in comparison with the known case in which the lower capacitor electrode 71 and the pixel electrode 9a are directly connected via the contact hole formed in the third interlayer insulating film 43.

Accordingly, the liquid crystal device 1 according to this embodiment shows an increased open area ratio, which is the proportion of the open area of a pixel, providing high-quality display. Particularly, when the pixel pitch is decreased to meet the demand for higher display quality, it becomes more difficult to decrease the area of the unopen area by microfabricating wires or electrodes, so that the use of the connecting conductive film 93 in place of the contact hole offers significant advantages in increasing the open area ratio.

Moreover, the liquid crystal device 1 according to this embodiment can be constructed such that the thickness of the side wall 91 is reduced in a range that the insulation between the connecting conductive film 93 and the TFT 30 is maintained. This allows an increase in the area of the upper capacitor electrode 300 from the end 300a toward the side wall 91 by the amount of the decrease in the thickness of the side wall 91, thus allowing an increase in he overlapping area of the upper capacitor electrode 300 and the lower capacitor electrode 71, as viewed from the top. This allows an increase in the storage capacitor 70 configured by the upper capacitor electrode 300, the lower capacitor electrode 71, and the dielectric film 75. This further enhances the potential holding characteristic by the storage capacitor, thus allowing a further improvement in display characteristic such as contrast and flickering.

In addition, the liquid crystal device 1 according to the embodiment can be constructed such that the unevenness of the multilayer structure on the TFT substrate due to the contact holes is decreased because the lower capacitor electrode 71 and the upper capacitor electrode 300 are electrically connected by the connecting conductive film 93 in place of the contact holes. This prevents the display quality of the liquid crystal device 1 from decreasing because of the unevenness that decreases the flatness of the pixel electrode 9a formed on the upper capacitor electrode 300 and the lower capacitor electrode 71.

Moreover, with the liquid crystal device 1 according to this embodiment, the number of the contact holes to be formed on the TFT array substrate 10 can be remarkably decreased because the lower capacitor electrode 71 and the pixel electrode 9a are electrically connected by selfalignment contact using the connecting conductive film 93.

More specifically, as shown in FIG. 4, the two pixels adjacent in the Y-direction have two contact holes 83, two contact holes 85, and one contact hole 81. Thus, each pixel has two and half contact holes, so that the number of the contact holes on the TFT array substrate 10 can be reduced in comparison with electrical connection of the lower capacitor electrode 71 and the upper capacitor electrode 300 with the contact holes.

In addition, since the contact hole 81 is shared by two adjacent pixels, the number of contact holes on the TFT array substrate 10 can be remarkably decreased.

This arrangement can reduce defects such as poor contact caused by accumulation of minute foreign matter in the contact holes, thus enhancing the manufacturing yield of the liquid crystal device 1.

Thus, the liquid crystal device 1 according to the embodiment shows an improved display quality and improved manufacturing yield, so that a liquid crystal device excellent both in quality and cost can be provided.

Referring to FIG. 8, the end 300a of the upper capacitor electrode 300 faces inner walls 96a, 96b, and 96c of the notch 95 of the upper capacitor electrode 300 which is partially cut away so that the lower capacitor electrode 71 is exposed. FIG. 8 does not show the connecting conductive film 93 that covers the notch 95, the side wall 91, and the second interlayer insulating film 42 for the convenience of description.

The notch 95 is formed in such a way that the upper capacitor electrode 300 is partly removed by a known etching method such as anisotropic etching so that the end extending in the Y-direction is partly open in the X-direction, as viewed from the top. The notch 95 is defined by the three inner walls 96a, 96b, and 96c that are formed by cutting away the upper capacitor electrode 300.

The side wall 91 extends along the inner walls 91a, 96b, and 96c of the notch 95 of the upper capacitor electrode 300. For example, the side wall 91 shown in FIG. 7 is the inner wall 96b. The side wall 91 electrically insulates the end 300a of the upper capacitor electrode 300 and the connecting conductive film 93 from each other while exposing the surface of the lower capacitor electrode 71 which extends into the space surrounded by the inner walls 91a, 96b, and 96c of the notch 95.

Thus, with the liquid crystal device 1, the contact resistance between the lower capacitor electrode 71 and the connecting conductive film 93 can be reduced by the wide electrical contact area of the connecting conductive film 93 and the lower capacitor electrode 71, so that electrical insulation between the connecting conductive film 93 and the upper capacitor electrode 300 is maintained by the side wall 91 even if part of the upper capacitor electrode 300 is removed.

As described above, the arrangement of the liquid crystal device 1 according to this embodiment can increase the open area ratio of pixels even with a small pixel pitch and prevent a decrease in yield due to defects such as poor contact which may be generated at the forming of contact holes. This provides an electrooptic device such as a liquid crystal device capable of displaying high-quality images at low manufacturing cost. In addition, the arrangement can decrease the unevenness of the TFT array substrate 10 due to the presence of contact holes and enhance the storage capacitor, thus improving the display quality of electrooptic devices such as liquid crystal devices. Accordingly, the electrooptic device according to this embodiment offers a remarkable advantage of providing excellent quality and cost performance.

2. Method for Manufacturing Electrooptic Device

Referring to FIGS. 9A to 9C and FIGS. 10A to 10C, a method for manufacturing the above-described electrooptic device will be described. FIGS. 9A to 9C and FIGS. 10A to 10C are cross-sectional views of the electrooptic device, showing the principal manufacturing process of the method of this embodiment. The method will be described mainly about the process of forming an electrical connection between the pixel electrode 9a and the lower capacitor electrode 71 via the connecting conductive film 93.

Figure 9A:
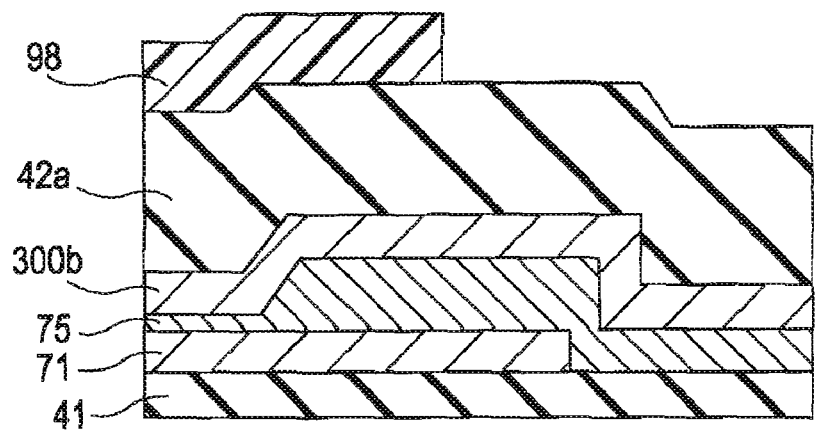
FIG. 9A is a cross-sectional view of the electrooptic device according to the embodiment, showing a principal manufacturing process thereof.

Referring to FIG. 9A, the first interlayer insulating film 41, the lower capacitor electrode 71, the dielectric film 75, an upper capacitor electrode 300b, a second interlayer insulating film 42a, and a resist film 98 are formed on the TFT array substrate 10. The elements disposed under the lower capacitor electrode 71 in FIGS. 5 and 6 have been formed before the lower capacitor electrode 71 is formed. The data line 6a and the contact hole 81 are formed in parallel with or before or after the process of forming the connecting conductive film 93.

Figure 9B:
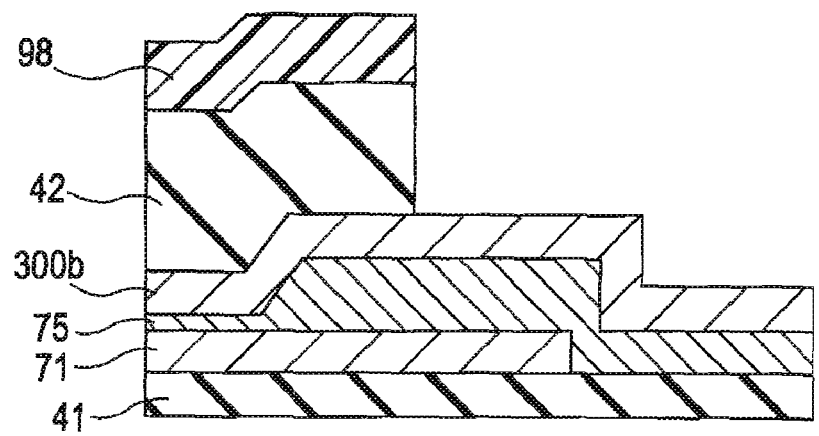
FIG. 9B is a cross-sectional view of the electrooptic device according to the embodiment, showing the principal manufacturing process.

Referring next to FIG. 9B, the portion of the second interlayer insulating film 42a which is not coated with the resist film 98 is etched to form the second interlayer insulating film 42, thereby partially exposing the upper capacitor electrode 300b.

Figure 9C:
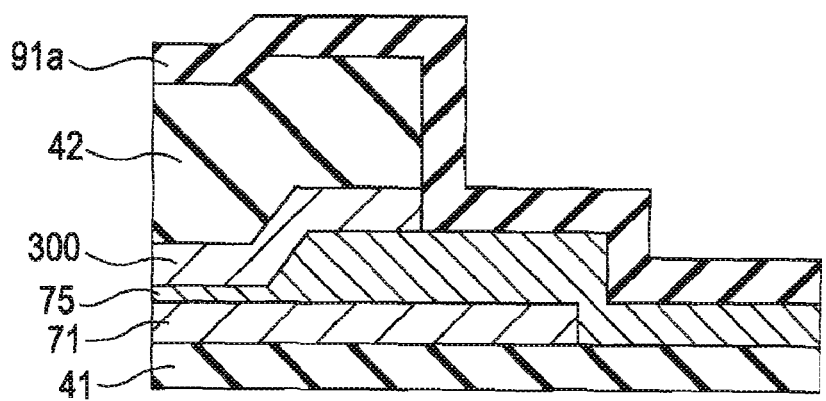
FIG. 9C is a cross-sectional view of the electrooptic device according to the embodiment, showing the principal manufacturing process.

Referring then to FIG. 9C, the portion of the upper capacitor electrode 300b which is not coated by the second interlayer insulating film 42 is removed by anisotropic etching to form the upper capacitor electrode 300, and then an insulating film 91a is formed along the surface of the exposed dielectric film 75, the end of the upper capacitor electrode 300, and the end and surface of the second interlayer insulating film 42.

Figure 10A:
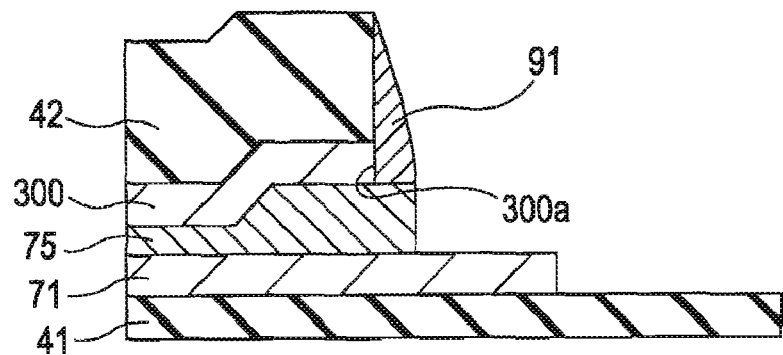
FIG. 10A is a cross-sectional view of the electrooptic device according to the embodiment, showing the principal manufacturing process.

Referring now to FIG. 10A, the side wall 91 is formed along the end 300a of the upper capacitor electrode 300 by anisotropic etching of the insulating film 91a from thereabove. The portion of the insulating film 91a which extends vertically along the end 300a of the upper capacitor electrode 300 is vertically thicker than the portion along the surface of the dielectric film 75 and the portion along the upper surface of the second interlayer insulating film 42. Accordingly, even if the insulating film 91a is uniformly subjected to the anisotropic etching, the portion of the insulating film 91a serving as the side wall 91 remains.

Figure 10B:
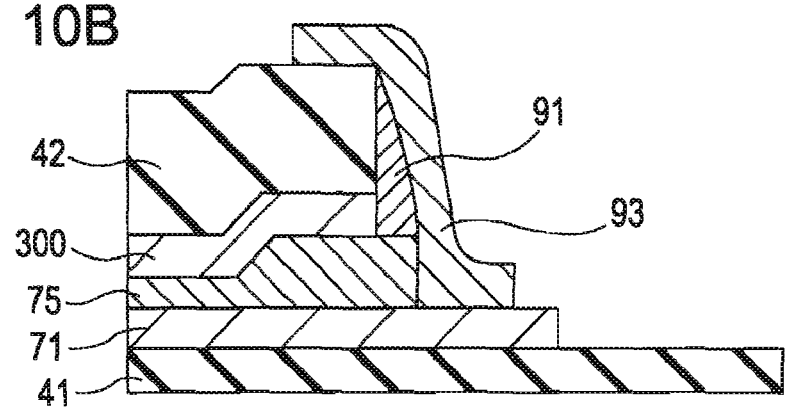
FIG. 10B is a cross-sectional view of the electrooptic device according to the embodiment, showing the principal manufacturing process.
Figure 10C:
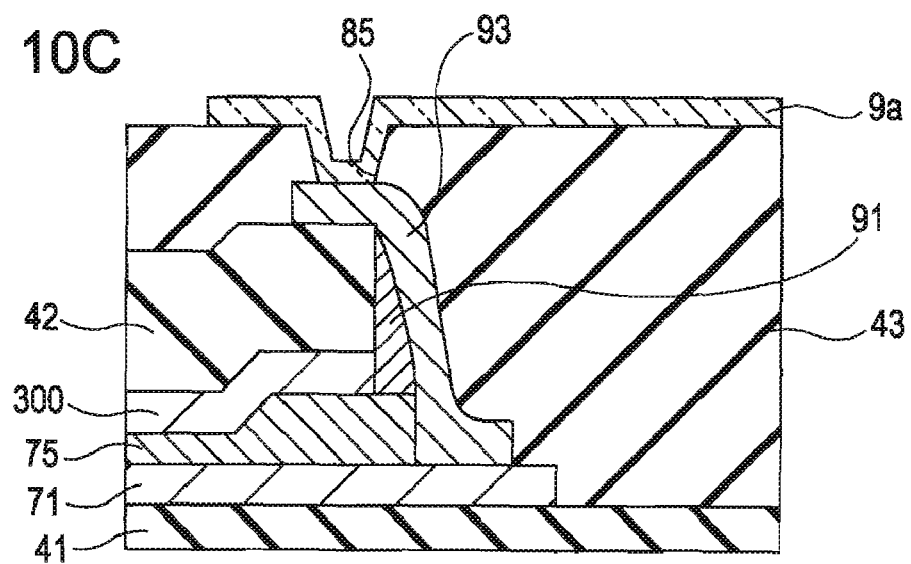
FIG. 10C is a cross-sectional view of the electrooptic device according to the embodiment, showing the principal manufacturing process.

Referring to FIG. 10B, a conductive film is formed along the upper surface of the second interlayer insulating film 42, the surface of the side wall 91, the part of the lower capacitor electrode 71 which is not covered with the dielectric film 75, and the surface of the first Interlayer insulating film 41 and then the conductive film is patterned into a specified shape to form the connecting conductive film 93. The connecting conductive film 93 is in contact with the lower capacitor electrode 71 and extends to the upper surface of the second interlayer insulating film 42.

Then, after the third interlayer insulating film 43 is formed so as to cover the connecting conductive film 93, the contact hole 85 is formed in the third interlayer insulating film 43 so as to expose the part of the connecting conductive film 93 extending over the upper surface of the second interlayer insulating film 42 to form the pixel electrode 9a electrically connected to the connecting conductive film 93.

Thereafter, an alignment layer and a liquid crystal layer are formed on the pixel electrode 9a, on which the opposing substrate 20 is disposed to form the liquid crystal device 1.

In the method of manufacturing the electrooptic device according to this embodiment, the connecting conductive film 93 is formed so as to maintain electrical insulation with the upper capacitor electrode 300 using the side wall 91 without a contact hole. The use of the connecting conductive film 93 eliminates the need for the mask that is used in forming the contact holes. The selfalignment contact in which the pixel electrode 9a and the lower capacitor electrode 71 are connected via the connecting conductive film 93 that is formed without using the mask because no contact hole is formed is easier than conventional electrical connection in which the conductive elements on and under the insulating layer are electrically connected via the contact holes.

Accordingly, as has been described above, high-display-quality electrooptic devices such as liquid crystal devices can be manufactured and the manufacturing yield can be enhanced, so that electrooptic devices excellent both in quality and cost can be manufactured.

3. Connection Structure of Conductive Layer

Figure 11:
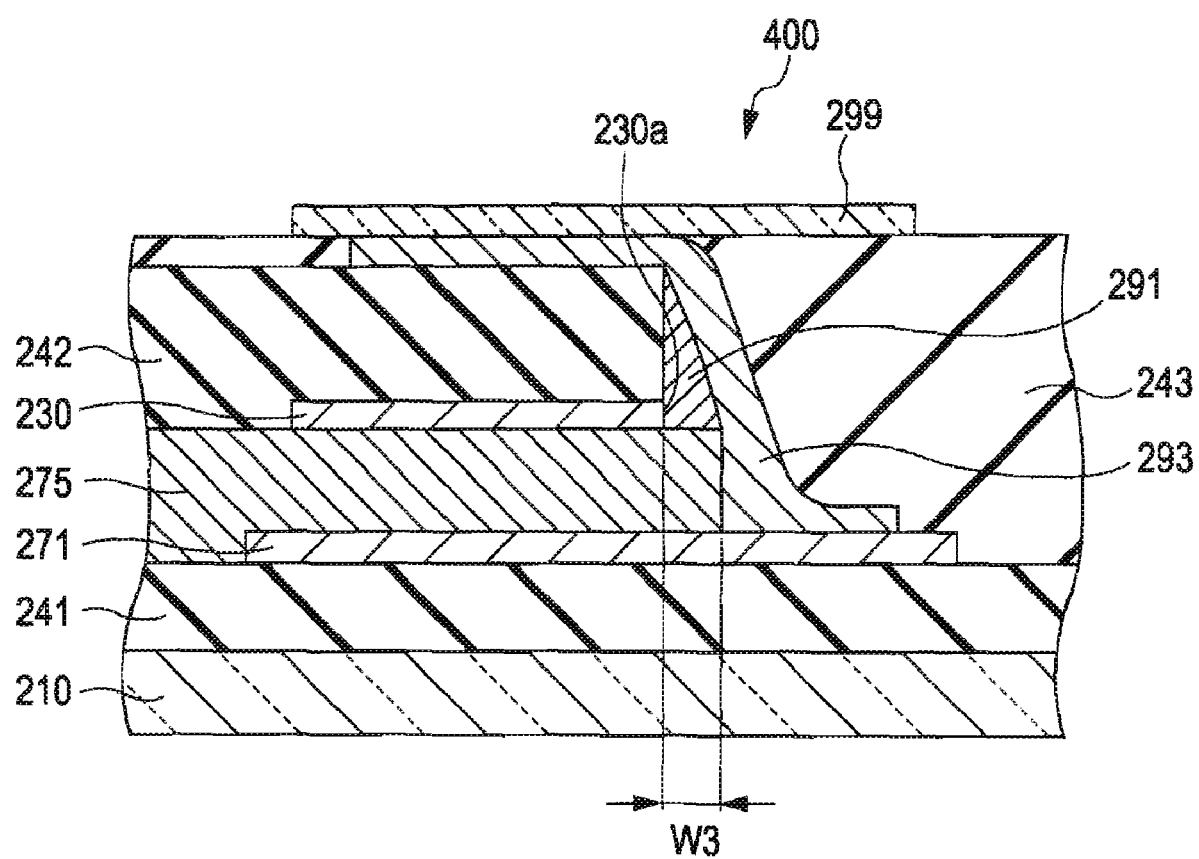
FIG. 11 is an enlarged cross-sectional view of the connection structure of the embodiment.

A connection structure of the conductive layer according to the embodiment will be described with reference to FIG. 11. FIG. 11 is a cross-sectional view of the connection structure according to the embodiment, denoted by numeral 400, showing an enlarged cross section of the semiconductor device of FIG. 5. The connection structure according to this embodiment is applicable to any devices or substrates in which conductive elements such as wires and electrodes on and under an insulating layer are electrically connected.

Referring to FIG. 11, the connection structure 400 includes wiring layers 230 and 271 formed above a substrate 210, a side wall 291, a wiring layer 271, a connecting wire 293, and a wiring layer 299.

The wiring layer 271 is formed on the substrate 210 with an insulating layer 241 in between, and projects partly from an insulating layer 275 formed on the wiring layer 271 to the right and left in the drawing.

The wiring layer 230 is formed on the wiring layer 271 with the insulating layer 275 formed on the wiring layer 271 in between. Thus, the wiring layers 271 and 230 are electrically insulated from each other by the insulating layer 275.

The side wall 291 is made of an insulating film and disposed at an end 230a of the wiring layer 230 and extends along the thickness of the wiring layer 230. The connecting wire 293 is disposed on the opposite side of the side wall 291 with respect to the end 230a of the wiring layer 230, and extends along the thickness of the wiring layer 230. Accordingly, the wiring layer 230 and the connecting wire 293 are located on both sides of the side wall 291 in the lateral direction of the drawing, so that the wiring layer 230 and the connecting wire 293 are insulated from each other by the side wall 291.

The connecting wire 293 extends from the surface of the part of the connecting wiring layer 271 protecting from the insulating layer 275 in the lateral direction of the drawing through the surface of the side wall 291 to the surface of the insulating layer 242 formed on the wiring layer 230. The wiring layer 299 is formed on an insulating layer 243 in such a manner as to be in contact with the part of the connecting wire 293 exposed from the insulating layer 243.

Thus, the connecting wire 293 electrically connects the wiring layer 299 and the wiring layer 271 while being electrically insulated from the wiring layer 230 by the side wall 291.

Here, the side wall 291 has only to insulate the connecting wire 293 and the wiring layer 230 from each other. Accordingly, the distance between the connecting wire 293 and the wiring layer 230 can be reduced in the lateral direction of the drawing by reducing the width W3 of the side wall 291 within the confines of maintaining the insulation between the connecting wire 293 and the wiring layer 230, so that the connection structure 400 can be reduced in size as compared with the case where the wiring layer 299 and the wiring layer 271 are electrically connected via the contact holes of the insulating layer 243.

Consequently, the connection structure of the embodiment provides the remarkable advantage of reducing the size of the device with the size reduction of the connection structure 400.

4. Electronic Equipment

Figure 12:
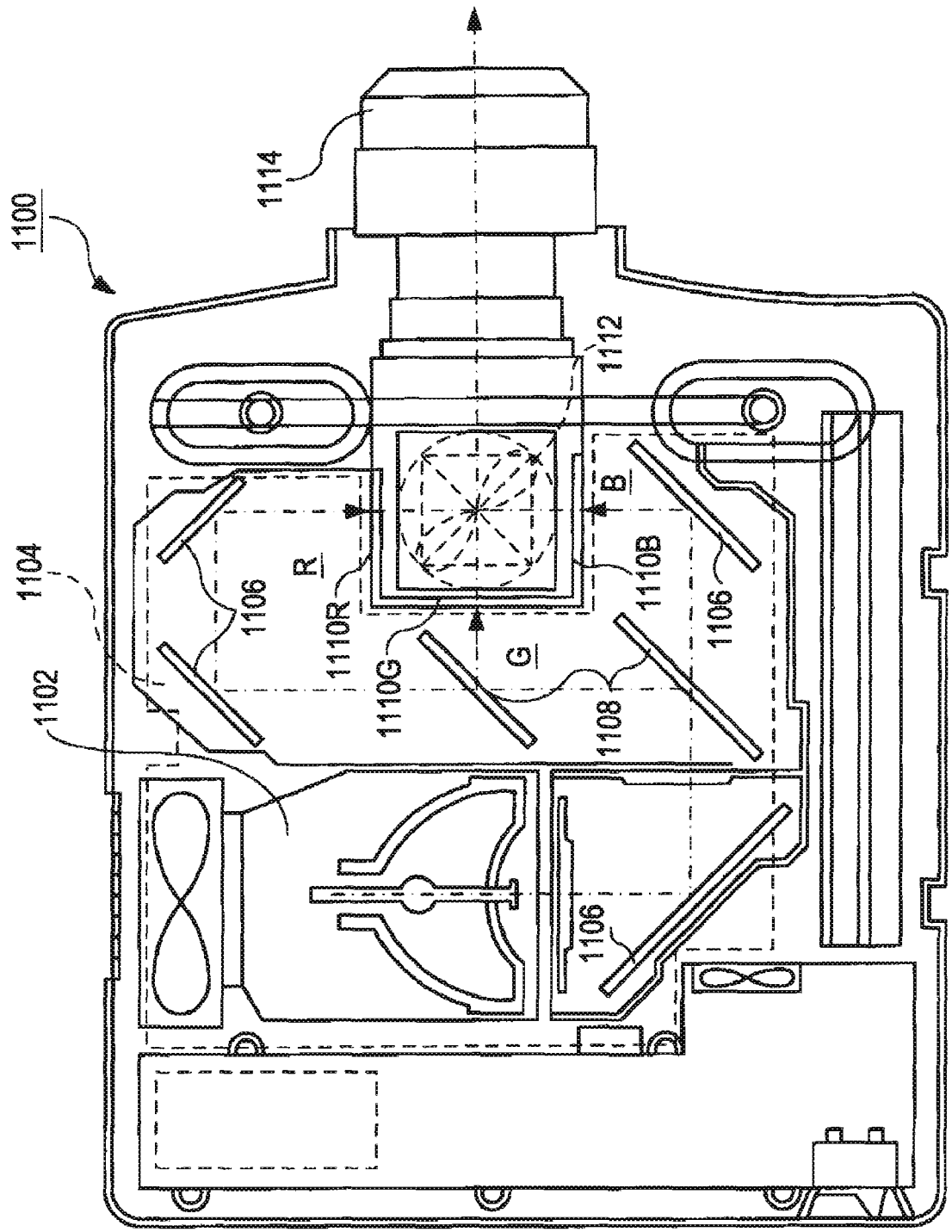
FIG. 12 is a plan view of an example of electronic equipment including the electrooptic device according to the embodiment.

Referring to FIG. 12, an application of the foregoing liquid crystal device to various electronic equipment will be described. Electronic equipment according to this embodiment is a projector that uses the liquid crystal device as a light valve. FIG. 12 is a plan view of a projector 1100 that is an example of the electronic equipment including the liquid crystal device. As shown in FIG. 12, the projector 1100 has therein a lamp unit 1102 using a white light source such as a halogen lamp. The light emitted from the lamp unit 1102 is divided into the three primary colors of light by four mirrors 116 and two dichroic mirrors 1108 disposed in a light guide 1104, and enters liquid crystal panels 1110R, 1110B, and 1110G serving as light valves for the primary colors.

The structures of the liquid crystal panels 1110R, 1110B, and 1110G are the same as that of the foregoing liquid crystal device, which are driven by the signals of the primary colors K, G, and B supplied from an image-signal processing circuit The lights modulated by the liquid crystal panels 1110R, 1110B, and 1110G are incident on a dichroic prism 1112 from three directions. The dichroic prism 1112 refracts R and B lights at 90 degrees and allows G light to travel in a straight line. Accordingly, images of the respective colors are composed, so that a color image is projected onto a screen or the like through a projection lens 1114.

Speaking of the display images through the liquid crystal panels 1110R, 1110B, and 1110G, the display image through the liquid crystal panel 1110G is laterally reversed from those by the liquid crystal panels 1110R and 1110B. The liquid crystal panels 1110R, 1110B, and 1110G need no color filters because lights corresponding to the respective primary colors of light are incident thereon by the dichroic mirrors 1108.

With the arrangement including the liquid crystal device according to this embodiment, various compact electronic equipment capable of high-quality display can be achieved such as projection display apparatus, mobile phones, electronic notepads, word processors, view-finder or monitor-direct-view video tape recorders, work stations, videophones, POS terminals, and touch panels.

The entire disclosure of Japanese Patent Application No. 2006-009583, filed Jan. 18, 2006 is expressly incorporated by reference herein.

What is claimed is:

1. An electrooptic device comprising:
    a plurality of data lines and a plurality of scanning lines that intersect each other on a substrate;
    pixels corresponding to intersections of the data lines and the scanning lines;
    a first conductive layer provided for one of the pixels, a dielectric film provided on the first conductive layer and a second conductive layer provided on the dielectric film, the dielectric film having a first sidewall at an end and the second conductive layer having a second sidewall at an end, the first conductive layer being a pixel-potential-side capacitor electrode, the second conductive layer being a fixed-potential-side capacitor electrode maintained at a fixed potential, and the second conductive layer being positioned above the first conductive layer;
    a storage capacitor including the first conductive layer, the dielectric film, and the second conductive layer;
    a thin film transistor having a gate electrode, a source, and a drain, a data line being connected to the source, a scanning line being connected to the gate electrode, and the first conductive layer being connected to the drain;
    an interlayer insulating film provided above and in contact with the second conductive layer, the interlayer insulating film having a third sidewall at an end;
    a pixel electrode provided above the second conductive layer and electrically insulated from the second conductive layer;
    an insulating sidewall covering the first, second, and third sidewalls, the insulating sidewall being a separate layer from the interlayer insulating film; and
    a connecting conductive film that is disposed on an upper surface of the interlayer insulating film and that covers the insulating sidewall, the connecting conductive film being extended along the thickness of the second conductive layer to electrically connect the first conductive layer with the pixel electrode, the connecting conductive film and the pixel electrode being separate layers from each other and being connected together such that all contact between the connecting conductive film and the pixel electrode completely overlaps the second conductive film in plan view, wherein
    a portion of the second conductive layer is disposed directly over the gate electrode, the source, and the drain of the thin film transistor, and
    the connecting conductive film electrically connects the first conductive layer with the pixel electrode without a contact hole in the interlayer insulating film.

2. The electrooptic device according to claim 1, the end of the second conductive layer being disposed above the first conductive film in the plan view.

3. The electrooptic device according to claim 1, further comprising:
    the second conductive layer having a constant potential.

4. The electrooptic device according to claim 1, the first conductive layer being a polysilicon film; and
    the conductivity of the second conductive layer being higher than that of the polysilicon film.

5. The electrooptic device according to claim 1, further comprising:
    a plurality of thin-film transistors whose sources are individually electrically connected to the data lines, and whose gates are individually electrically connected to the scanning lines;
    of the plurality of thin-film transistors, a pair of first and second adjacent thin-film transistors arranged in the direction in which the data lines extend being arranged such that the sources and the drains are in mirror symmetry in the direction in which the data lines extend; and
    a contact hole that electrically connects the source of the first thin-film transistor to the data line and a contact hole that electrically connects the source of the second thin-film transistor to the data line being the same.

6. A method for manufacturing an electrooptic device, the method comprising:
    forming a thin film transistor on a substrate, the thin film transistor having a gate electrode, a source, and a drain;
    forming a first conductive layer provided for one of pixels corresponding to one of intersections of a plurality of data lines and a plurality of scanning lines on the substrate, the first conductive layer being connected to the drain, a data line being connected to the source, and a scanning line being connected to the gate electrode;
    forming a dielectric film on the first conductive layer;
    forming a second conductive layer on the dielectric film, the dielectric film having a first sidewall at an end and the second conductive layer having a second sidewall at an end, the first conductive layer, the dielectric film, and the second conductive layer forming a storage capacitor;
    forming an interlayer insulating film disposed above and in contact with the second conductive layer, the interlayer insulating film having a third sidewall at an end;
    forming an insulating sidewall so as to cover the first, second, and third sidewalls and to form a separate layer from the interlayer insulating film;

forming a connecting conductive film disposed on an upper surface of the interlayer insulating film so as to cover the insulating sidewall and so as to extend along the thickness of the second conductive layer opposite to the end of the second conductive layer with the insulating sidewall in between; and forming a pixel electrode above the second conductive layer, the pixel electrode being electrically connected to the first conductive layer via the connecting conductive film, the connecting conductive film and the pixel electrode being separate layers from each other and being connected together such that all contact between the connecting conductive film and the pixel electrode completely overlaps the second conductive film in plan view, wherein the second conductive layer is a fixed-potential-side capacitor electrode maintained at a fixed potential, the first conductive layer is a pixel-potential-side capacitor electrode, and the second conductive layer is positioned above the first conductive layer, and a portion of the second conductive layer is disposed-en directly over the gate electrode, the source, and the drain of the thin film transistor, and the connecting conductive film electrically connects the pixel electrode to the first conductive layer without a contact hole in the interlayer insulating film.

7. A conductive-layer connection structure, comprising:

a first conductive layer on a substrate, a dielectric film on the first conductive layer, and a second conductive layer on the dielectric film, the dielectric film having a first sidewall at an end and the second conductive layer having a second sidewall at an end, the first conductive layer being a pixel-potential-side capacitor electrode, the second conductive layer being a fixed-potential-side capacitor electrode maintained at a fixed potential, and the second conductive layer being positioned above the first conductive layer;

a storage capacitor including the first conductive layer, the dielectric film, and the second conductive layer;

a thin film transistor having a gate electrode, a source and a drain;

an interlayer insulating film provided above and in contact with the second conductive layer, the interlayer insulating film having a third sidewall at an end;

an insulating sidewall covering the first, second, and third sidewalls, the insulating sidewall being a separate layer from the interlayer insulating film;

a connecting conductive film that is disposed on an upper surface of the interlayer insulating film and that covers the insulating sidewall, the connecting conductive film being extended along the thickness of the second conductive layer; and a pixel electrode provided above the second conductive layer and electrically connected to the first conductive layer via the connecting conductive film, the connecting conductive film and the pixel electrode being separate layers from each other and being connected together such that all contact between the connecting conductive film and the pixel electrode completely overlaps the second conductive film in plan view, wherein a portion of the second conductive layer is disposed directly over the gate electrode, the source, and the drain of the thin film transistor, and the connecting conductive film electrically connects the pixel electrode to the first conductive layer without a contact hole in the interlayer insulating film.

8. An electrooptic device according to claim 1, the connecting conductive film having an upper portion and lower portion that is parallel to the pixel electrode, the upper portion of the connecting conductive film being connected to and extending along a portion of the pixel electrode at a position that overlaps the second conductive film in the plan view.

* * * * *